(12) United States Patent
Milne et al.

(10) Patent No.: US 9,874,047 B2
(45) Date of Patent: Jan. 23, 2018

(54) CARRIER FOR ELECTRICAL TRACES OF AN ACTUATOR OF A LATCH

(71) Applicants: Robert Milne, Sterling Heights, MI (US); John R. Rice, New Baltimore, MI (US); Donald M. Perkins, Sterling Heights, MI (US); Ian J. Dow, Bloomfield, MI (US)

(72) Inventors: Robert Milne, Sterling Heights, MI (US); John R. Rice, New Baltimore, MI (US); Donald M. Perkins, Sterling Heights, MI (US); Ian J. Dow, Bloomfield, MI (US)

(73) Assignee: INTEVA PRODUCTS, LLC, Troy, MI (US)

( * ) Notice: Subject to any disclaimer, the term of this patent is extended or adjusted under 35 U.S.C. 154(b) by 0 days.

(21) Appl. No.: 14/623,426

(22) Filed: Feb. 16, 2015

(65) Prior Publication Data

US 2015/0252593 A1 Sep. 10, 2015

Related U.S. Application Data

(60) Provisional application No. 61/949,683, filed on Mar. 7, 2014.

(51) Int. Cl.
| | | |
|---|---|---|
| H05K 5/00 | (2006.01) | |
| E05B 81/54 | (2014.01) | |
| H05K 7/14 | (2006.01) | |
| E05B 81/06 | (2014.01) | |
| E05B 81/24 | (2014.01) | |
| E05B 81/34 | (2014.01) | |

(52) U.S. Cl.
CPC .............. *E05B 81/54* (2013.01); *E05B 81/06* (2013.01); *E05B 81/25* (2013.01); *E05B 81/34* (2013.01); *H05K 5/0004* (2013.01); *H05K 5/0069* (2013.01); *H05K 7/14* (2013.01)

(58) Field of Classification Search
CPC ...................................................... H05K 5/0069
USPC ........................................... 174/541; 439/329
See application file for complete search history.

(56) References Cited

U.S. PATENT DOCUMENTS

| | | | |
|---|---|---|---|
| 3,969,789 A | 7/1976 | Wize | |
| 6,455,950 B1 * | 9/2002 | Nishitani | B60R 16/0207 307/10.1 |
| 6,494,522 B1 * | 12/2002 | Drewniok | B60R 16/0207 296/146.7 |
| 6,547,572 B1 * | 4/2003 | Burdick | B60R 16/0238 439/76.2 |
| 6,568,741 B1 | 5/2003 | Leung | |
| 6,679,531 B2 | 1/2004 | Rogers, Jr. et al. | |
| 8,348,310 B2 | 1/2013 | Vazquez et al. | |
| 2005/0118854 A1 * | 6/2005 | Lange | H01R 12/7017 439/329 |
| 2010/0127512 A1 | 5/2010 | Vazquez et al. | |
| 2011/0204659 A1 | 8/2011 | Estrada et al. | |

(Continued)

*Primary Examiner* — Hung V Ngo (74) *Attorney, Agent, or Firm* — Cantor Colburn LLP (57) ABSTRACT

A carrier for electrical traces of an actuator for a latch is provided. The carrier is configured to receive a plurality of electrical traces; and wherein the carrier has features for receiving and retaining at least one switch, wherein the carrier is configured for use in at least two distinct configurations each of which being different from the other.

11 Claims, 8 Drawing Sheets

(56) References Cited

U.S. PATENT DOCUMENTS

2012/0292927 A1 11/2012 Vazquez et al.
2014/0292000 A1 10/2014 Vazquez et al.

* cited by examiner

CARRIER FOR ELECTRICAL TRACES OF AN ACTUATOR OF A LATCH

CROSS REFERENCE TO RELATED APPLICATIONS

This application claims the benefit of U.S. Provisional Patent Application Ser. No. 61/949,683 filed Mar. 7, 2014.

BACKGROUND

Various embodiments of the present invention relate to a latch and more particularly, an actuator for a latch.

In some applications, latches are required to perform numerous operations within limited confines of an application area of the item they are installed in. Still further, some latches include motorized actuators for performing some of these operations. In addition, the motor and/or the actuator will also be operatively coupled to switches and connector circuits in order to detect a state of the actuator and provide that information to the motor or a controller operatively coupled to the motor.

Accordingly, it is desirable to an apparatus and method for allowing multiple switches to be added or removed from the system, latch or actuator without requiring multiple components or completely different designs.

SUMMARY OF THE INVENTION

A carrier for electrical traces of an actuator for a latch is provided. The carrier being configured to receive a plurality of electrical traces; and wherein the carrier has features for receiving and retaining at least one switch, wherein the carrier is configured for use in at least two distinct configurations each of which being different from the other.

BRIEF DESCRIPTION OF THE DRAWINGS

These and/or other features, aspects, and advantages of the present invention will become better understood when the following detailed description is read with reference to the accompanying drawings in which like characters represent like parts throughout the drawings, wherein.

Although the drawings represent varied embodiments and features of the present invention, the drawings are not necessarily to scale and certain features may be exaggerated in order to illustrate and explain exemplary embodiments the present invention. The exemplification set forth herein illustrates several aspects of the invention, in one form, and such exemplification is not to be construed as limiting the scope of the invention in any manner.

DETAILED DESCRIPTION

Reference is made to the following U.S. Pat. Nos. 3,969,789; 6,568,741; 6,679,531; 8,348,310 and U.S. Patent Publication Nos. US 2010/0127512; US 2011/0204659; US 2012/0292927 and provisional Patent Application Ser. No. 61/806,530 filed Mar. 29, 2013, the entire contents each of which are incorporated herein by reference thereto.

Referring now to the FIGS. and in particular, FIGS. 1-4, a latch 10 is illustrated. In one embodiment, the latch 10 is a vehicle door latch or any other type of vehicle latch. Latch 10 has an actuator 12 operatively coupled to components of the latch 10 that are located within a latch housing 14.

Latch 10 may have a lock lever 16 rotatably mounted to the latch about an axis 18 for movement in the direction of arrows 20. The rotational movement of the lock lever actuates other component(s) of the latch 10, for example a detent lever or pawl that operatively engages a claw or fork bolt of the latch 10. It is, of course, understood that the lock lever 16 may also be configured to operatively engage other components of the latch 10 and the interaction of the lock lever 16 to the detent lever is one of many applications and/or operations that may be used alone or in combination with other features/operations of the latch 10.

In one embodiment, the lock lever 16 is driven by a motor 22 of the actuator 12 via linear motion of a movable link 24 in the direction of arrows 26. The moveable link 24 is pivotally connected to the lock lever at one end and a sector gear 28 at the other. The sector gear 28 is pivotally mounted to a housing 30 of the actuator 12 or any other location of the latch 10 such that movement in the direction of arrows 32 is possible. Sector gear 28 is configured to operatively engage a gear 34 rotatably mounted to a worm gear 36 rotatably mounted to the actuator housing 30 for rotation about an axis 38 in the direction of arrows 40. Worm gear 36 is operatively coupled to a worm 42 which is rotatably driven by motor 22. Gear 34 has a protrusion 44 that is located between a pair of features 46 and 48 of worm gear 36 such that as worm gear 36 rotates in one direction (e.g., clockwise) feature 46 will contact protrusion 44 and thus rotate sector gear 28 and accordingly move link 24 linearly such that lock link 16 can be rotated or pivoted. If the rotation of the worm 42 is reversed, the worm gear 36 will rotate counter clockwise and worm gear 36 will rotate and cause counter clockwise rotation of sector gear 28 via feature 48 contacting protrusion 44 and thus causes rotational of pivotal movement of sector gear 28 in an opposite direction to that caused by feature 46 contacting protrusion 44 and thus link 24 is also moved in an opposite linear direction and lock link 16 rotates or pivots in an opposite direction to that when feature 46 contacts protrusion 44. Accordingly and through the rotational movement of the worm gear 36 in the direction of arrows 40 a range of operational movements of components of the latch 10 is possible.

As illustrated, the sector gear 28 is connected or operatively coupled to the lock lever 16 through the movable link 24. The sector gear 28 engages or is operatively coupled to a gear train 50 connected to the drive motor 22. Accordingly, the actuator 12 has a motor drive 22 engaging a gear train 50 to connect with a sector gear 28. The sector gear 28 has an integral arm 52 and rotates about a fixed pivot 54. The arm 52 travels through an arc created by the rotation of the motor 22 and the gear train 50. The motion developed by the gear rotation and the arm 52 develops a linear motion at the end of the arm 52 that equals the linear travel of the lock lever 16. The arm 52 of the sector gear 28 is connected to the lock lever 16 by a link 24 with pivoting connections 56 and 58 allowing for the change between the rotational movement and the linear travel.

This arrangement or design disclosed herein also allows for a compact design. In addition, this design or arrangement also allows for less movable components required to be located between the motor 22 and lock lever 18 thus reducing cost, noise, size requirements, possible wear issues etc. In one embodiment, the actuator 12 is configured to be perpendicularly arranged with respect to a plane 70, which is parallel to or corresponds with housing 14.

As mentioned, above the actuator 12 has motor 22 and worm drive 42 engaging a worm gear 36 with floating pinion gear 34. The pinion gear 34 engages the sector gear 28 that is attached to the link 22. The link 24 is coupled to the lock lever 16 of the latch 10 to move from a locked to unlocked position. A switch 72 is positioned to be actuated by a surface 74 of protrusion 44 as it rotates with gear 34 and actuation of switch 72 will identify the unlocked position of the latch 10 with the capability for an additional switch 76 to be provided to identify a door ajar condition. It is understood, that latch 10 may be configured with only switch 72 or switches 72 and 76 or still other switches. When activated, the motor 22 will drive the gear system or gear train 50, move the link 24 and the latch lever 16. The lever 16 will stay in the locked or unlocked position as the gear train 50 returns to a central position by a spring force of a spring 78 (illustrated schematically by dashed lines) acting on the worm gear 36. In other words, sector gear 28 is not pivoted or rotated until either one of features 46 or 48 contacts protrusion 44. The will occur when the motor 22 is operated in one of two directions and reversing the flow of current to the motor 22 will reverse the direction of the motor 22 and move the latch lever or lock lever 16 in an opposite direction thus, changing the state of the latch 10 from lock to unlock or vice versa. Once the state has been changed the spring 78 will again return the gear train 50 and/or worm gear 36 to a central position.

Gear 34 is rotatably mounted to a worm gear 36 rotatably mounted to the actuator housing 30 for rotation about an axis 38 in the direction of arrows 40. Accordingly, gear 34 can rotate with respect to worm gear 36. Worm gear 36 is operatively coupled to a worm 42 which is rotatably driven by motor 22. Gear 34 has a protrusion 44 that is located between a pair of features 46 and 48 of worm gear 36 such that as worm gear 36 rotates in one direction (e.g., clockwise) from a home or central position and gear 34 is in the position illustrated in FIGS. 1, 2 and 4, feature 46 will contact protrusion 44 and thus rotate sector gear 28 clockwise and accordingly move link 24 linearly such that lock link 16 can be rotated or pivoted.

Figure 2:
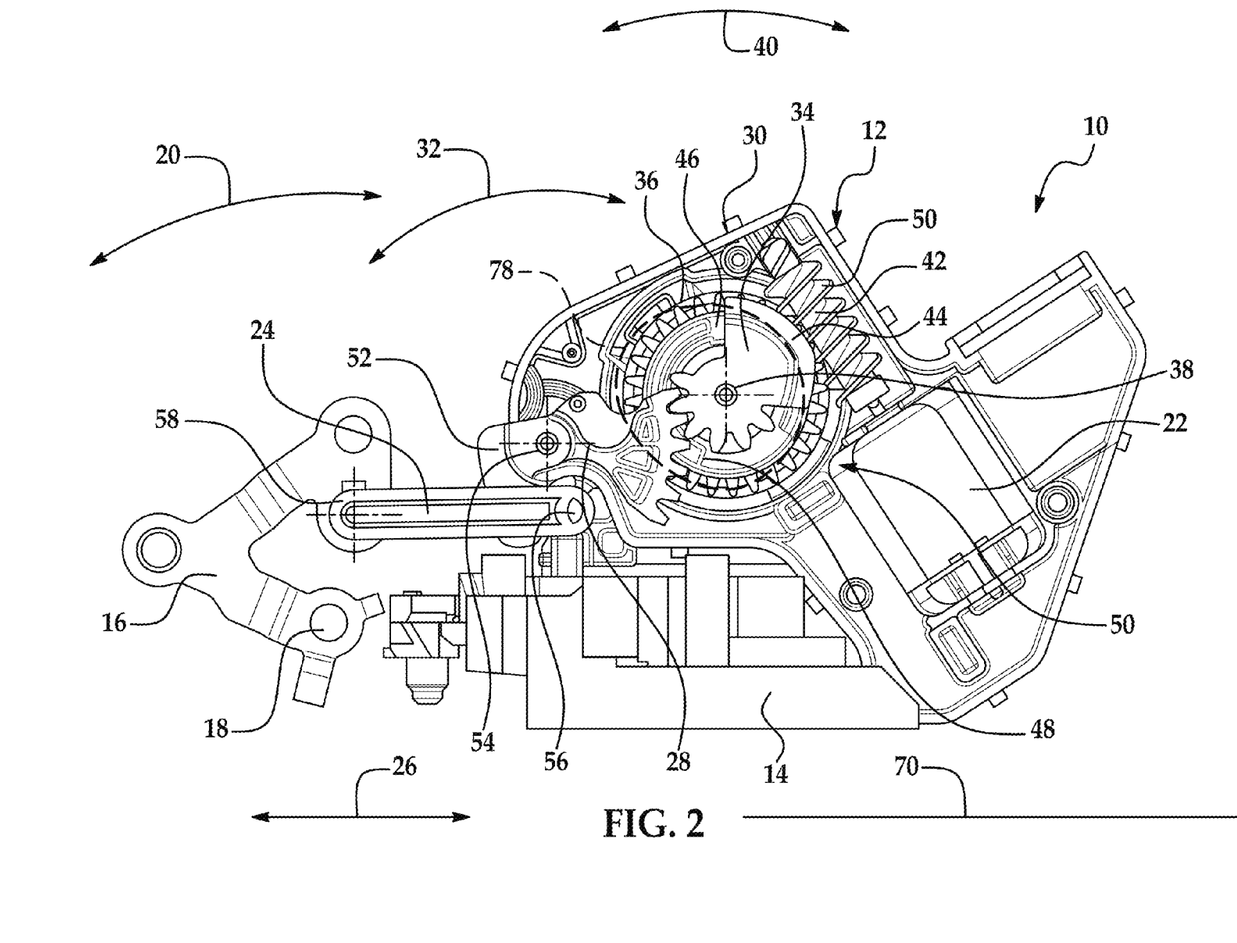
Figure 3:
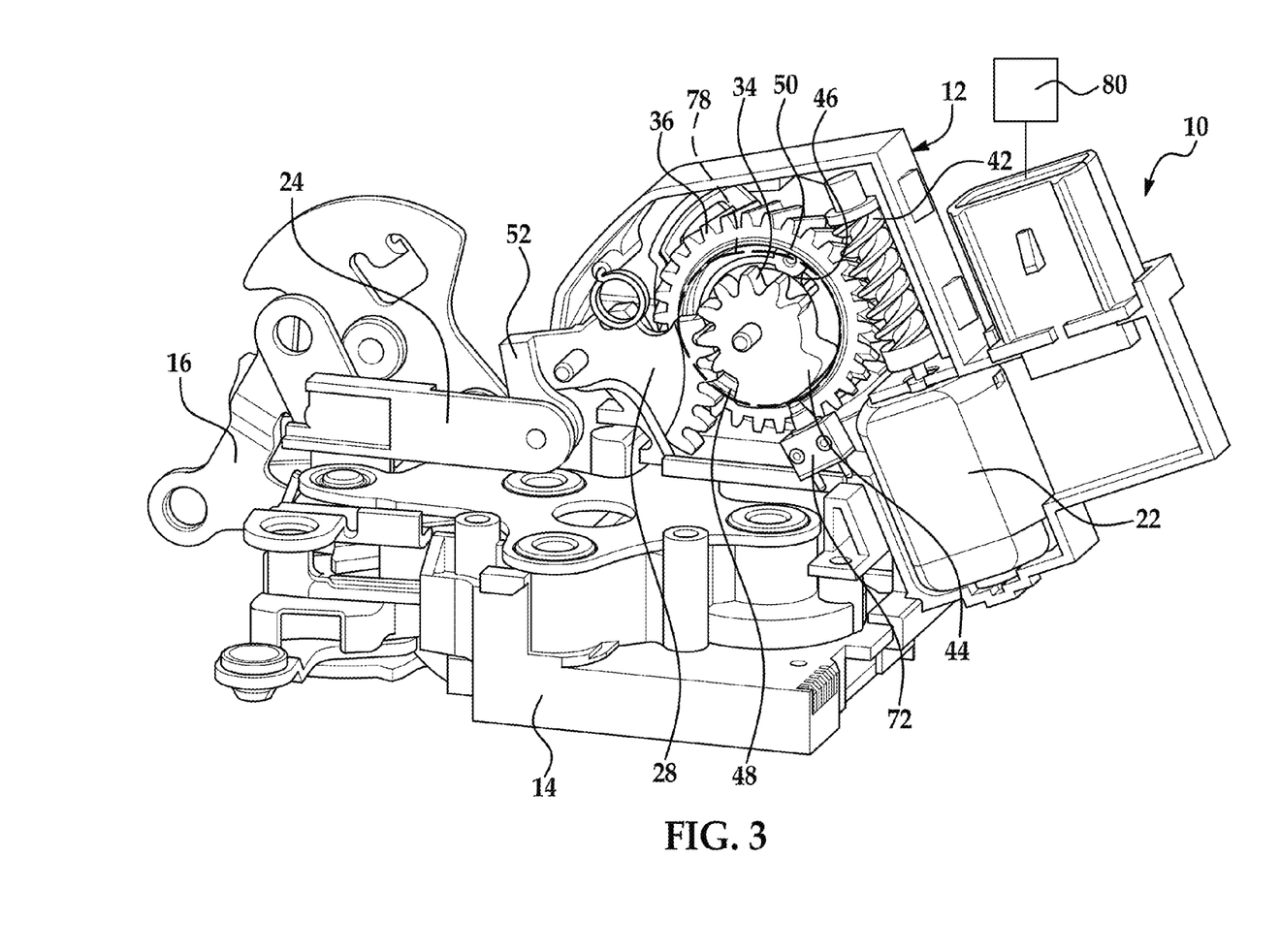
Figure 4:
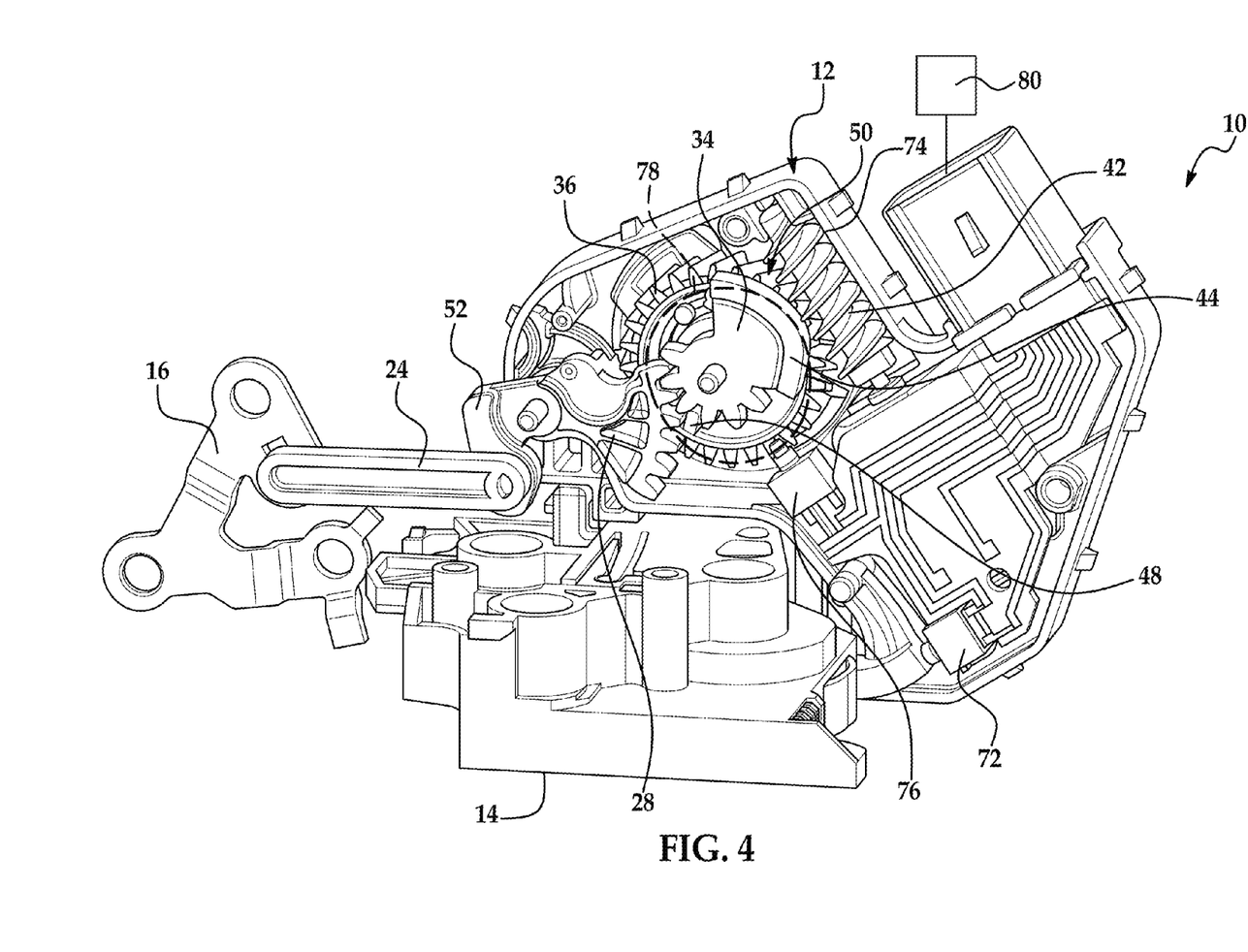
Figure 5:
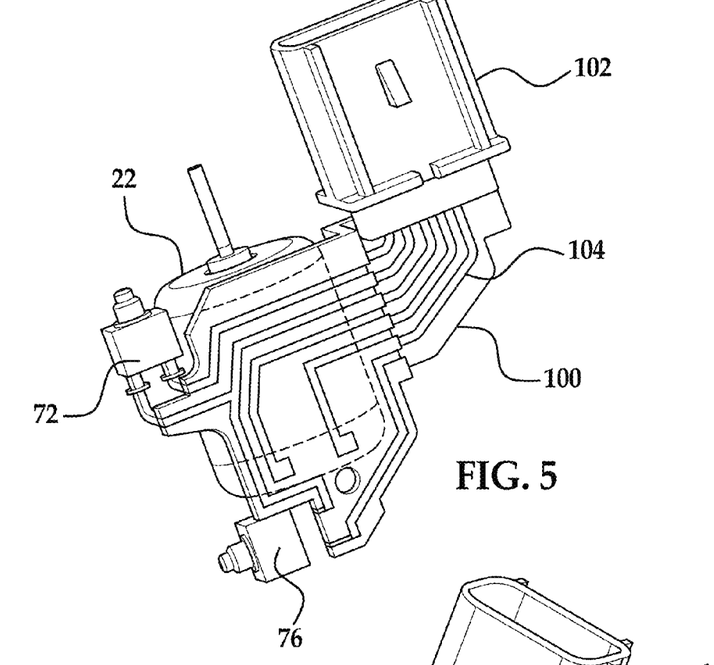
FIGS. 5-11 are views of a connector for use with the latch.
Figure 6:
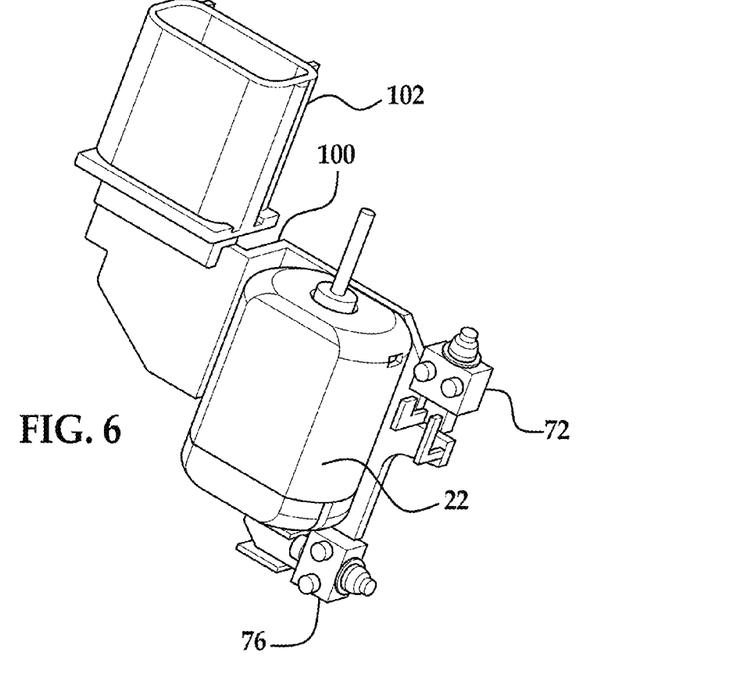
Figure 7:
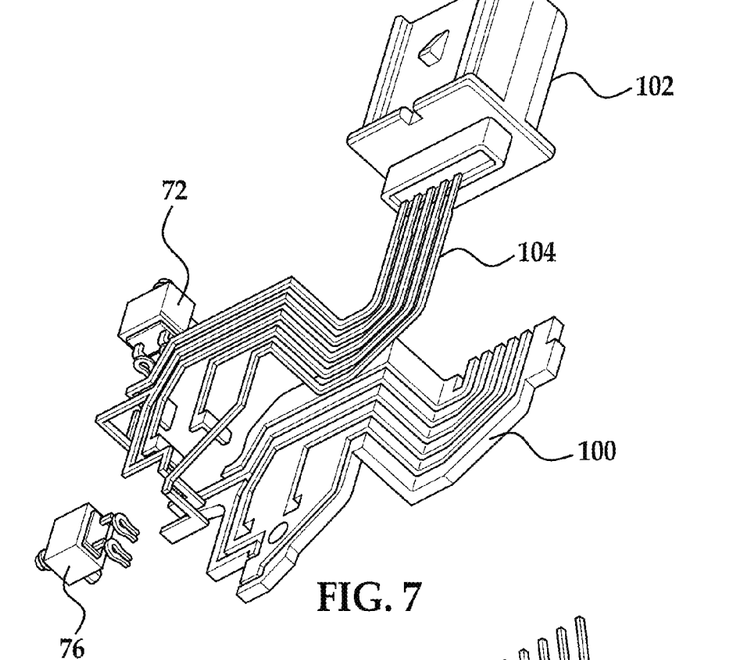
Figure 8:
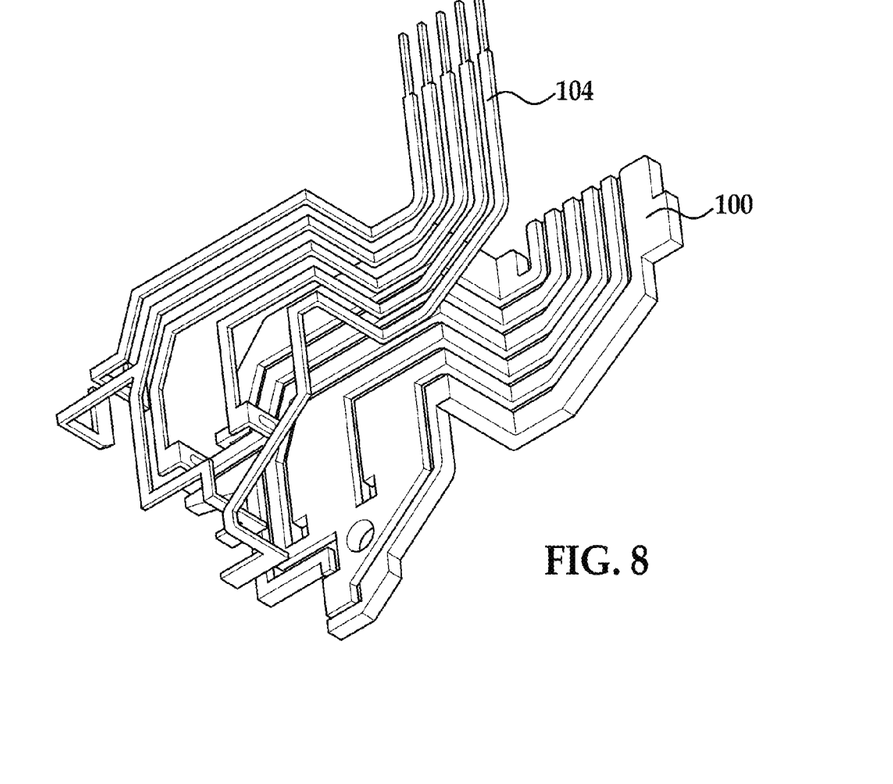
Figure 9:
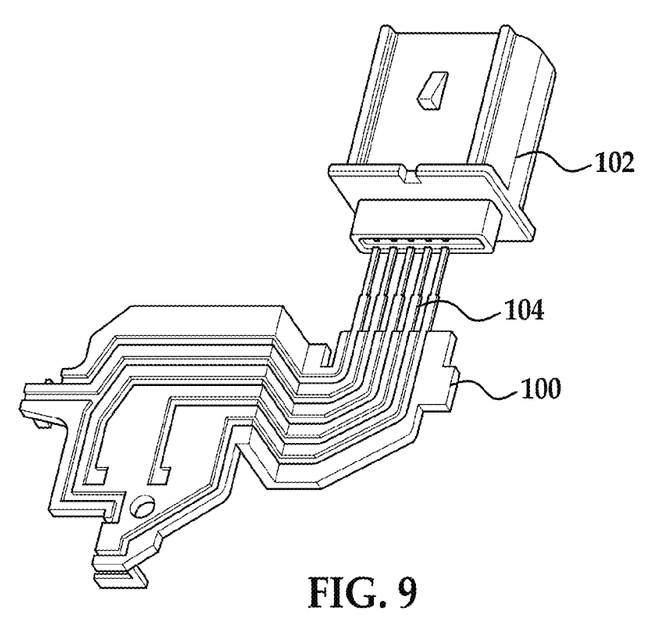
Figure 10:
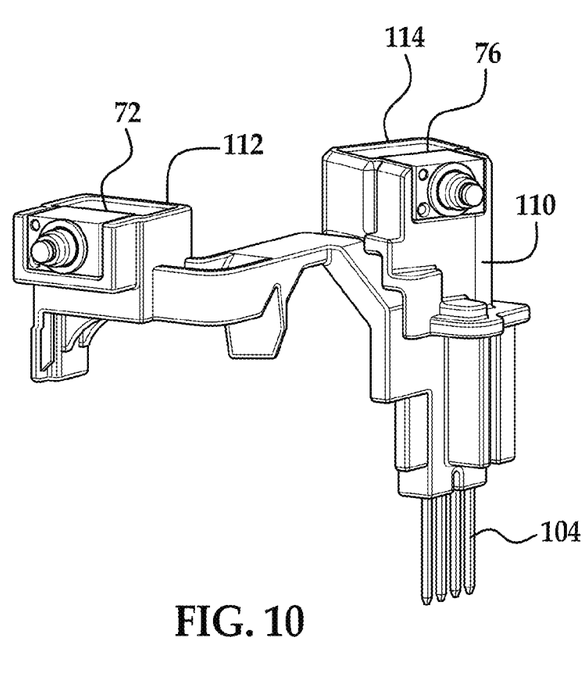
Figure 11:
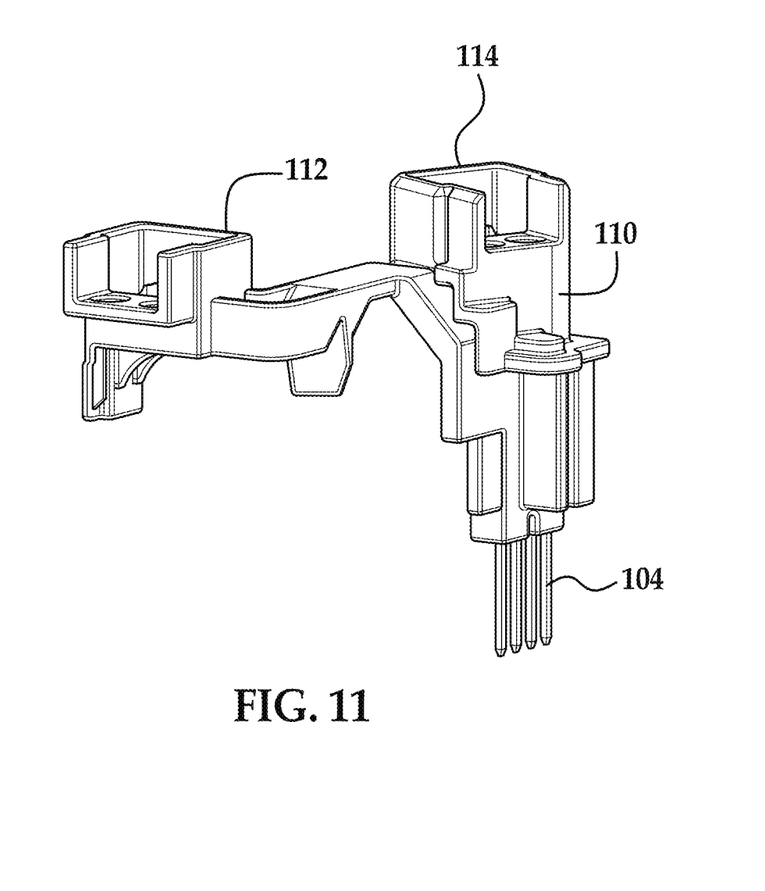

Once, the motor 22 is denergized worm gear 36 rotates counter clockwise back into the central or home position (see at least FIGS. 1-4) via a spring biasing force however, gear 34 will remain in the position illustrated in at least FIG. 3. At this point (e.g., when the worm gear 36 rotates counter clockwise back to the home or central position due to the spring biasing force and gear 34 remains in the position illustrated in FIG. 3) feature 48 is positioned adjacent to protrusion 40 such that counter clockwise rotation of worm gear 36 will cause counter clockwise rotation of gear 34 via feature 48. Thereafter and when the motor is denergized worm gear 36 returns to the home or central position and gear 34 remains in the position illustrated in FIGS. 1, 2 and 4 such that feature 46 is adjacent to protrusion 40 and is ready to move gear 34 via clockwise movement of worm gear 36.

Worm gear 36 is spring biased back into the home or central position by a spring 78 located between worm gear 36 and actuator housing 30. As mentioned above, worm gear 36 is operatively coupled to the worm 42 which is rotatably driven by the motor. Gear 34 is rotatably mounted to worm gear 36 about an axis such that gear 34 can rotate with respect to the worm gear 36 about axis.

If the rotation of the worm 42 is reversed, the worm gear 36 will reverse its rotation and thus cause an appropriate rotation of the sector gear 28 as either feature 46 or 48 contacts protrusion 44 depending on the location of gear 34 and thus causes rotational of pivotal movement of sector gear 28 and link 24 is also moved in a corresponding linear direction. Accordingly and through the rotational movement of the worm gear 36 in the direction of arrows 40 a range of operational movements of components of the latch 10 is possible.

Figure 1:
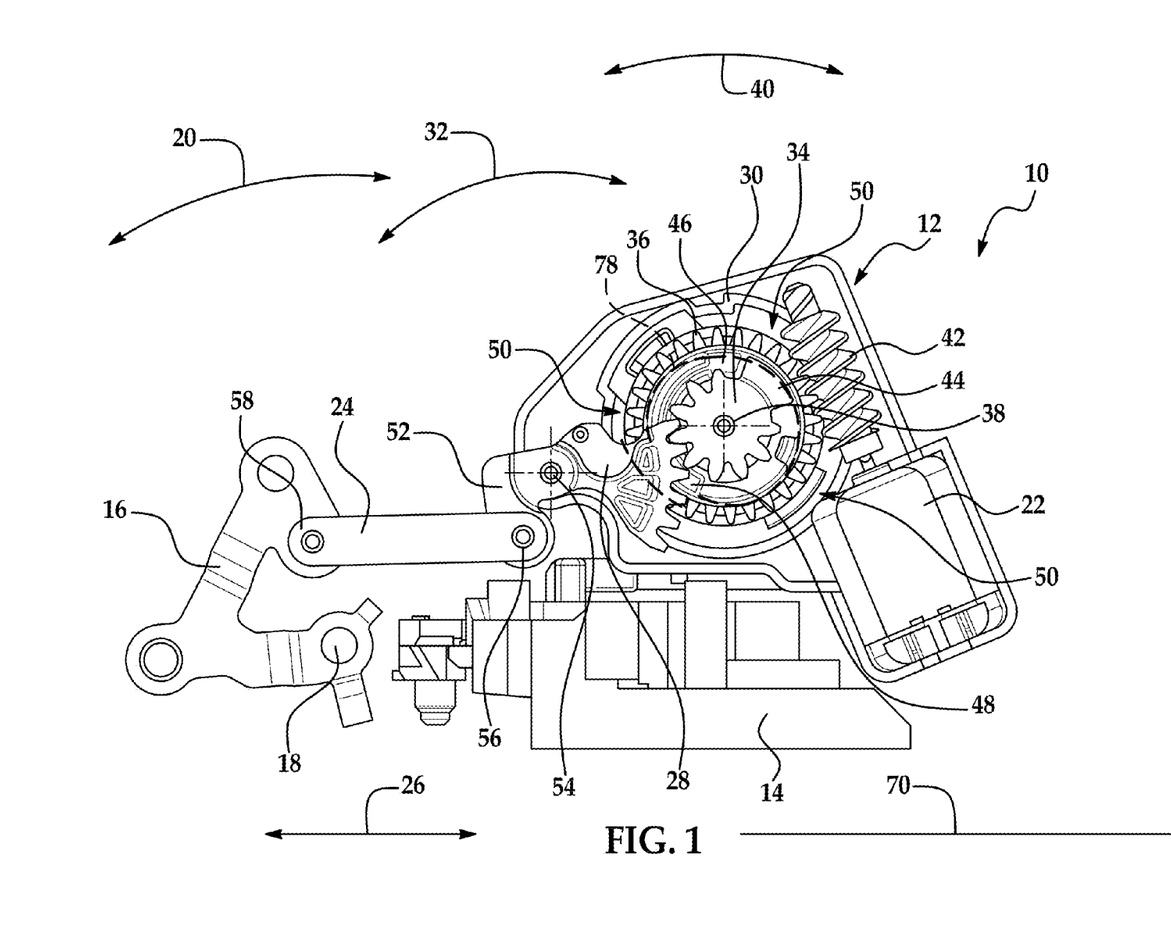
FIGS. 1-4 are views of a latch.

It is noted that the protrusion 44 of FIG. 1 has a slightly different configuration than that illustrated in FIG. 2. It is also noted that the distance between features 46 and 48 is larger than protrusion 44 such that the rotational movement of gear 34 with respect to worm gear 36 is possible.

Therefore, a latch 10 with an actuator 12 capable of providing full angular travel of the lock lever 16 with linear motion of a link 24 is provided.

Switches 72 and 76 are operatively coupled to a controller or microcontroller 80 that is provided with the states of switches 72 and 76 and can thus operate the motor in the aforementioned opposite directions based upon the states or information received from the switches 72 and 76.

As mentioned above, it is desirable to an apparatus and method for allowing multiple switches to be added or removed from the system, latch or actuator without requiring multiple components or completely different designs. Accordingly, it is also desirable to develop a way to build the motor and connector circuits for the actuator so that it can be flexible in order to allow for multiple switches to be added or removed depending on the system required. The design also needs to be compact with an integrated connector and motor attachments while also allowing for the use of micro switch technology.

One such design is illustrated in at least FIGS. 5-11. Here a plastic carrier 100 is provided. Plastic carrier 100 is configured to provide mounting for the motor 22, switches 72 and 76, a connector 102 and circuits 104.

In one embodiment, the circuits 104 can be but are not limited to metal traces or wires stranded or solid captured in the plastic carrier. The traces may be insert molded or encapsulated in the carrier or simply placed therein after molding of the carrier in accordance with any know method of forming. The carrier will also provide a mounting for the motor, switches and the connector. In one embodiment, the parts will be separate components and thus allow for the same to be built together in several different configurations depending on the configuration of the separate components each or which may have a different configuration but will still be able to be secured to the carrier and thus allow for design modification without adverse impact or cost the would require a redesign of the whole design.

In some embodiments, the connector 102 is an independent component configured to be snap fittingly attached to the carrier. The connector may have a locator to allow for easier assembly to the carrier.

Use of a carrier 100 allows for flexibility in manufacturing with independent switches, traces and connector allowing for variability in number of circuits. The commonality of motor and micro switches with a standard connector installation also aids in manufacturability and reduced cost impact for various designs within a platform.

As such, common components reduce the manufacturing cost while also providing variety in a number of circuits. The separate components can snap fit together in order to provide flexibility on the available circuitry.

In one embodiment, a housing 110 for the switches is also provided. Housing 110 will have features or areas 112 and 114 configured to receive and retain switches, for example, switches 72 and 76. Of course, the number and orientation of switches may be different than the specific configurations illustrated in the attached FIGS. For example, more or less than two switches may be contemplated and their orientation with respect to the carrier 100 may vary. Accordingly, housing 110 may have a variety of configurations and in some embodiments may be integrally formed with carrier 100 or alternatively be yet another separate component snap fittingly engaged to carrier 100 and as such numerous housings 110 or various configurations may be secured to carrier 100 to provide various configurations.

As used herein, the terms "first," "second," and the like, herein do not denote any order, quantity, or importance, but rather are used to distinguish one element from another, and the terms "a" and "an" herein do not denote a limitation of quantity, but rather denote the presence of at least one of the referenced item. In addition, it is noted that the terms "bottom" and "top" are used herein, unless otherwise noted, merely for convenience of description, and are not limited to any one position or spatial orientation.

The modifier "about" used in connection with a quantity is inclusive of the stated value and has the meaning dictated by the context (e.g., includes the degree of error associated with measurement of the particular quantity).

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A carrier of an actuator of a vehicle latch, the carrier having:
   a first plurality of features;
   a connector that is snap fittingly secured to the first plurality of features of the carrier;
   a plurality of electrical traces snap fittingly secured to the connector; and
   wherein the carrier has a second plurality of features for removably receiving and retaining at least one switch of the vehicle latch, wherein the at least one switch is secured to the plurality of electrical traces, and wherein the second plurality of features allow for the at least one switch to be secured to the carrier in at least two distinct configurations each of which being different from the other.

2. The carrier as in claim 1, wherein the carrier receives and retains a pair of switches each being located in distinct locations.

3. The carrier as in claim 2, wherein the carrier is formed from plastic.

4. The carrier as in claim 1, wherein the carrier has a housing that is integrally formed with the carrier.

5. The carrier as in claim 1, wherein the carrier has a housing that is snap fittingly secured to the carrier.

6. The carrier as in claim 1, wherein the carrier is removably secured to a housing of an actuator of a latch.

7. The carrier as in claim 1, wherein the second plurality of features are located in a housing of the carrier.

8. A vehicle latch, comprising:
   an actuator having a housing;
   a carrier removably secured to the housing, wherein the carrier has a plurality of first features;
   a connector that is snap fittingly secured to the first plurality of features of the carrier;
   a plurality of electrical traces snap fittingly secured to the connector; and
   wherein the carrier has a plurality of second features for removably receiving and retaining a pair of switches of the vehicle latch, wherein the pair of switches are secured to the plurality of electrical traces, and wherein the plurality of second features allow for the pair of switches to be secured to the carrier in at least two distinct configurations each of which being different from the other.

9. The latch as in claim 8, wherein the carrier has a housing that is snap fittingly secured to the carrier.

10. The latch as in claim 9, wherein the carrier is formed from plastic.

11. The latch as in claim 8, wherein the second plurality of features are housings removably secured to the carrier.

* * * * *